United States Patent
Harano et al.

(10) Patent No.: US 8,196,594 B2
(45) Date of Patent: Jun. 12, 2012

(54) APPARATUS FOR REMOVING FOREIGN MATERIAL FROM SUBSTRATE AND METHOD FOR REMOVING FOREIGN MATERIAL FROM SUBSTRATE

(75) Inventors: Riichiro Harano, Tokyo (JP); Yoshiaki Tatsumi, Tokyo (JP); Kinya Miyashita, Tokyo (JP); Hiroshi Fujisawa, Nara (JP)

(73) Assignee: Creative Technology Corporation, Tokyo (JP)

( * ) Notice: Subject to any disclaimer, the term of this patent is extended or adjusted under 35 U.S.C. 154(b) by 569 days.

(21) Appl. No.: 11/988,514

(22) PCT Filed: Jul. 11, 2006

(86) PCT No.: PCT/JP2006/313721
§ 371 (c)(1),
(2), (4) Date: Jan. 9, 2008

(87) PCT Pub. No.: WO2007/007731
PCT Pub. Date: Jan. 18, 2007

(65) Prior Publication Data
US 2009/0250077 A1 Oct. 8, 2009

(30) Foreign Application Priority Data

Jul. 12, 2005 (JP) ................................ 2005-231315

(51) Int. Cl.
*B08B 3/00* (2006.01)
(52) U.S. Cl. ......... 134/149; 134/133; 134/134; 134/137
(58) Field of Classification Search ........................ None
See application file for complete search history.

(56) References Cited

U.S. PATENT DOCUMENTS 5,336,442 A * 8/1994 Kuramochi ................... 252/511
(Continued)

FOREIGN PATENT DOCUMENTS

JP 61-56843 A 3/1986
(Continued)

OTHER PUBLICATIONS

JPO machine translation of JP 11220013 retrieved from http://www19.ipdl.inpit.go.jp/PA1/cgi-bin/PA1DETAIL and http://www4.ipdl.inpit.go.jp/Tokujitu/PAJdetail.ipdl?N0000=60&N0120=01&N2001=2&N3001=H11-220013 on Jun. 10, 2011.*

(Continued)

*Primary Examiner* — Michael Kornakov
*Assistant Examiner* — Eric Golightly
(74) *Attorney, Agent, or Firm* — Birch, Stewart, Kolasch & Birch, LLP (57) ABSTRACT

Provided are an apparatus for and a method of removing foreign materials from a substrate which reliably remove the foreign materials, eliminate a chance of redeposition of the foreign materials, and are applicable even to large-size substrates. The apparatus for removing foreign materials includes electrostatic chucks (2, 3) forming a substrate chucking surface (4) to which the substrate (1) is attracted; a resin sheet supplying means (9) for supplying a resin sheet (5) to the substrate chucking surface (4); resin sheet collecting means (13) for collecting the supplied resin sheet (5); and a substrate transfer means for transferring the substrate (1). The substrate (1) supplied to the electrostatic chucks (2, 3) by the substrate transfer means is attracted to the substrate chucking surface (4) through the resin sheet (5), and a foreign material (22) deposited on a side of the substrate chucking surface (4) of the substrate (1) is transferred onto the resin sheet (5) and removed.

16 Claims, 8 Drawing Sheets

U.S. PATENT DOCUMENTS

| | | | |
|---|---|---|---|
| 6,256,187 B1 * | 7/2001 | Matsunaga et al. | 361/234 |
| 6,563,195 B1 * | 5/2003 | Tomaru et al. | 257/620 |
| 2003/0164226 A1 * | 9/2003 | Kanno et al. | 156/345.51 |

FOREIGN PATENT DOCUMENTS

| | | | |
|---|---|---|---|
| JP | 63-140546 A | 6/1988 |
| JP | 6-120175 A | 4/1994 |
| JP | 6-232108 A | 8/1994 |
| JP | 7-94462 A | 4/1995 |
| JP | 8-80453 A | 3/1996 |
| JP | 8-222538 A | 8/1996 |
| JP | 10-125640 A | 5/1998 |
| JP | 11-102849 A | 4/1999 |
| JP | 11-220013 A | 8/1999 |
| JP | 2002-83795 A | 3/2002 |
| JP | 2002-261154 A | 9/2002 |
| JP | 2003-282671 A | 10/2003 |
| JP | 3534847 B2 | 3/2004 |
| JP | 2006-32876 A | 2/2006 |

OTHER PUBLICATIONS

JPO machine translation of JP 2006032876, retrieved from http://www4.ipdl.inpit.go.jp/Tokujitu/PAJdetail.ipdl?N0000=60&N0120=01&N2001=2&N3001=2006-032876 on Sep. 9, 2011.*

* cited by examiner

APPARATUS FOR REMOVING FOREIGN MATERIAL FROM SUBSTRATE AND METHOD FOR REMOVING FOREIGN MATERIAL FROM SUBSTRATE

TECHNICAL FIELD

The present invention relates to a technique for removing foreign materials deposited on, for example, a substrate which is made of silicon or a silicon compound and used in a semiconductor device manufacturing process or a substrate which is made of glass or a resin and used for a flat panel display or the like.

BACKGROUND ART

When semiconductor devices are to be manufactured on a substrate made of silicon, glass, resin, or the like, there occurs such a problem that the yield thereof is reduced by the presence of foreign materials such as dust and particles, which are deposited in the manufacturing apparatus or during movement between apparatuses. In recent years, it is required to control foreign materials on not only a front surface on which the semiconductor devices are formed but also a rear surface, that is, a surface which is in contact with apparatus or mechanism constituent members at the time of loading into the manufacturing apparatus, or at the time of handling in a transfer mechanism. This reason is as follows. When the foreign materials reside between the rear surface of a wafer (substrate) and a stage (substrate chucking surface) for holding the wafer, the wafer cannot be fixedly attached to the stage and thus is partially lifted up. Therefore, it is likely to cause a focus deviation in an exposure apparatus or it is likely that insulating layers for electrodes of an electrostatic chuck are damaged by the foreign materials deposited on the rear surface in an etching apparatus to cause irreparable damage to the electrode layers of the electrostatic chuck by discharging. In addition, there may be a problem in that the foreign materials are mixed into a formed layer during thin film formation in a CVD apparatus or the like.

In general, a wafer before semiconductor devices and the like are manufactured is subjected to some cleaning processing. However, there is a problem in that, for example, foreign materials separated in a cleaning bath for cleaning the wafer are deposited on another wafer to cause the dispersion of foreign material contaminants. In particular, in the case where the foreign materials are metal, when a semiconductor junction region and the like are contaminated by the foreign materials, the junction potential thereof varies. Therefore, the characteristics of the devices are deviated from design values, so an integrated circuit being a final product causes faulty operation.

An international guideline for such events is summarized by the organization named International Technology Roadmap for Semiconductors (ITRS) and published on the Internet homepage thereof (URL: http//public.itrs.net/). For example, in Front End Process of 2004 Update, with respect to a lithography and a tester which have strict requirements on, particularly, particles, an allowable particle guideline on a rear surface of a wafer in 2006 Update mentions that a particle size on a wafer having a diameter of 300 mm is 0.12 µm and the number of particles per wafer is 400. With respect to particles on a front surface, a critical particle size is 35 nm and the number of particles is 64. Further, a concentration of a metal foreign material in a gate oxide of a MOS transistor is desirably equal to or smaller than $0.5 \times 10^{10}$ atm/cm$^2$.

Incidentally, there is in principle no deposition of particles to a wafer which is just manufactured and shipped, and the wafer is normally transferred between apparatuses in a semiconductor manufacturing facility under a high-level clean environment, so foreign materials may be mainly deposited on the wafer in the semiconductor manufacturing apparatus or during the movement of the wafer between the apparatuses. Various processings are performed in the apparatus, so the probability of deposition of the foreign materials may be increased during, for example, the process of removing a photo resist used in the apparatus and the process of depositing a raw material on a surface of the wafer to form a thin film made of metal or the like and a process such as etching for removing a part of the wafer.

A method called an RCA cleaning method has been generally known as a method of removing the foreign materials deposited on a wafer. This is one of processings called wet cleaning and performed by a combination of two processings, i.e. the processing of removing particles using a mixture of ammonia solution and hydrogen peroxide solution, and the processing of removing metal ions using a mixture of hydrochloric acid and hydrogen peroxide solution. Processing called dry cleaning has been also known. For example, a method of adhering, in order to remove foreign materials deposited on the rear surface (substrate chucking surface side) of a semiconductor wafer, an adhesive tape thereto and then peeling off the adhesive tape, has been proposed (see Patent Document 1 and 2). In addition, there have been proposed, for example, a method of bring a wafer into contact with plasma to remove foreign materials deposited on the rear surface of the wafer by radicals in the plasma (see Patent Document 3), a method of supplying deionized water or the like while a wafer to which a predetermined cleaning solution is applied is rotated, thereby washing the cleaning solution (see Patent Document 4), a method of blowing an inert gas onto a surface of a wafer from a predetermined direction to remove foreign materials (see Patent Document 5), and a method of spraying a jet water stream containing deionized water on the surface of a wafer while the surface thereof is scrubbed with a brush, thereby removing foreign materials (see Patent Document 6).

However, with respect to the wet cleaning, as described above, it is likely to deposit new foreign materials in the cleaning solution. The preparation of the cleaning solution and the waste treatment thereof require a large amount of cost, so it is not desirable in these days in view of environmental protection. On the other hand, the method of adhering the adhesive tape in the dry cleaning is likely to damage the wafer by a stress applied to the wafer when the tape is peeled off. In particular, in recent years, with an increase in size of the wafer, a final cost per wafer increases (approximately several million yen to ten million yen). Therefore, in view of a case where a wafer is damaged or the like, this method involves a high risk. The plasma processing and the method of blowing the inert gas may cause the redeposition of the foreign materials which are temporarily scattered or the deposition of new foreign materials during processing. In particular, the plasma processing may cause the scattering of processing chamber constituent members resulting from ion bombardment during sputtering. The method of blowing the inert gas requires separate control of, for example, an impurity concentration of the gas to be used.

An application for a foreign material removing apparatus has been filed by the applicant of this application (see Patent Document 7).

Patent Document 1: JP 6-232108 A
Patent Document 2: JP 3534847 B
Patent Document 3: JP 6-120175 A
Patent Document 4: JP 7-94462 A
Patent Document 5: JP 8-222538 A
Patent Document 6: JP 11-102849 A
Patent Document 7: JP 2006-32876 A

DISCLOSURE OF THE INVENTION

Problems to be Solved by the Invention

While the control for foreign materials deposited on a substrate, used in a semiconductor manufacturing process, a liquid crystal panel manufacturing process, or the like becomes further strict, a means for easily and reliably removing the foreign materials is required. Therefore, the inventors of the present invention intensively studied a foreign material removing means capable of eliminating a chance of redeposition of the foreign materials to reliably remove the foreign materials and minimizing a chance of damaging the substrate even in the case of a large-size substrate. As a result, it was found that the problems might be solved when the substrate to be processed is attracted to an electrostatic chuck through a resin sheet, and the foreign materials deposited on the substrate are transferred to the resin sheet to remove the foreign materials. Therefore, the present invention is completed.

Thus, an object of the present invention is to provide an apparatus for removing foreign materials from a substrate capable of reliably removing the foreign materials deposited on the substrate to eliminate a chance of redeposition thereof and reliably removing the foreign materials from the substrate while a fear of damaging the substrate is avoided even in a case of a large-size substrate.

Another object of the present invention is to provide a method of removing foreign materials from a substrate capable of reliably removing foreign materials deposited on the substrate to eliminate a chance of redeposition thereof and being applied even to a large-size substrate without a chance of damaging the substrate.

Means for Solving the Problems

That is, the present invention relates to a foreign material removing apparatus for removing a foreign material deposited on a substrate, including: an electrostatic chuck forming a substrate chucking surface to which the substrate is attracted; resin sheet supplying means for supplying a resin sheet to the substrate chucking surface; resin sheet collecting means for collecting the supplied resin sheet; and substrate transfer means for transferring the substrate, in which: the substrate supplied to the electrostatic chuck by the substrate transfer means is attracted to the substrate chucking surface through the resin sheet supplied by the resin sheet supplying means; the foreign material deposited on a side of the substrate chucking surface of the substrate is transferred to the resin sheet and removed; and the resin sheet to which the foreign material is transferred is collected by the resin sheet collecting means.

The present invention further relates to a foreign material removing method of removing a foreign material deposited on a substrate, including: supplying the substrate to an electrostatic chuck forming a substrate chucking surface to which the substrate is attracted; and attracting the substrate to the substrate chucking surface through a resin sheet to transfer the foreign material deposited on a side of the substrate chucking surface of the substrate to the resin sheet, thereby removing the foreign material.

In the present invention, the substrate from which the foreign materials are removed is not particularly limited. Therefore, various substrates to be processed to manufacture a semiconductor device, a flat panel display, or the like can be used as an object. For example, a silicon wafer, a semiconductor substrate made of GaAs, SiC, or the like, a glass substrate, a resin substrate, or an organic EL substrate can be used. A shape of the substrate to be processed is not particularly limited. The foreign materials to be removed are ones that need to be removed from the substrate during various manufacturing processes and the like, and typical examples thereof include particles, dusts, resist deposits, and by-product produced in a process chamber.

In the present invention, a specific means for attracting the substrate to the electrostatic chuck through the resin sheet and transferring the foreign materials to the resin sheet to remove the foreign materials is not particularly limited. However, the following structural examples can be preferably provided.

Figure 1:
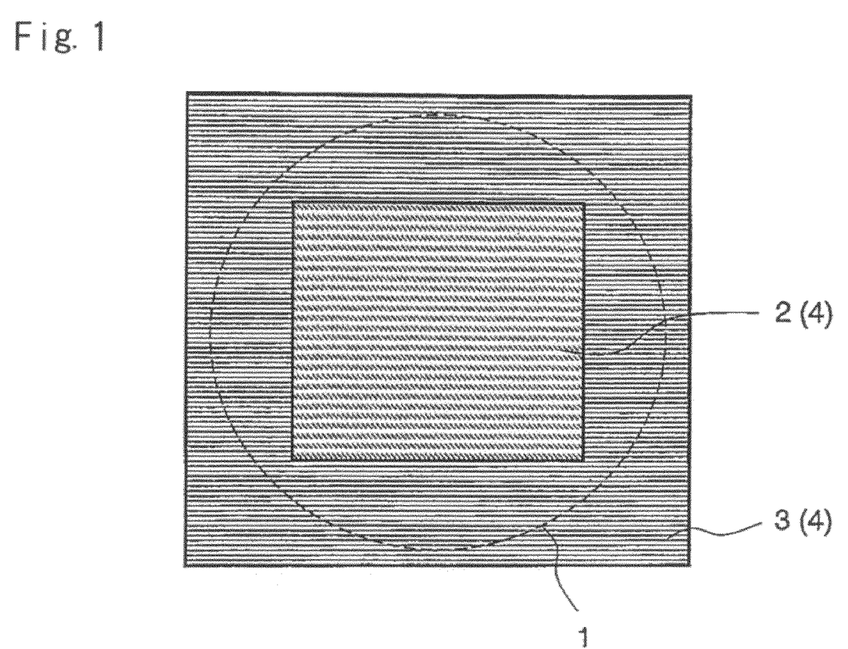
FIG. 1 is an explanatory plan view illustrating a case where a central electrostatic chuck and a peripheral electrostatic chuck form a substrate chucking surface.
Figure 2:
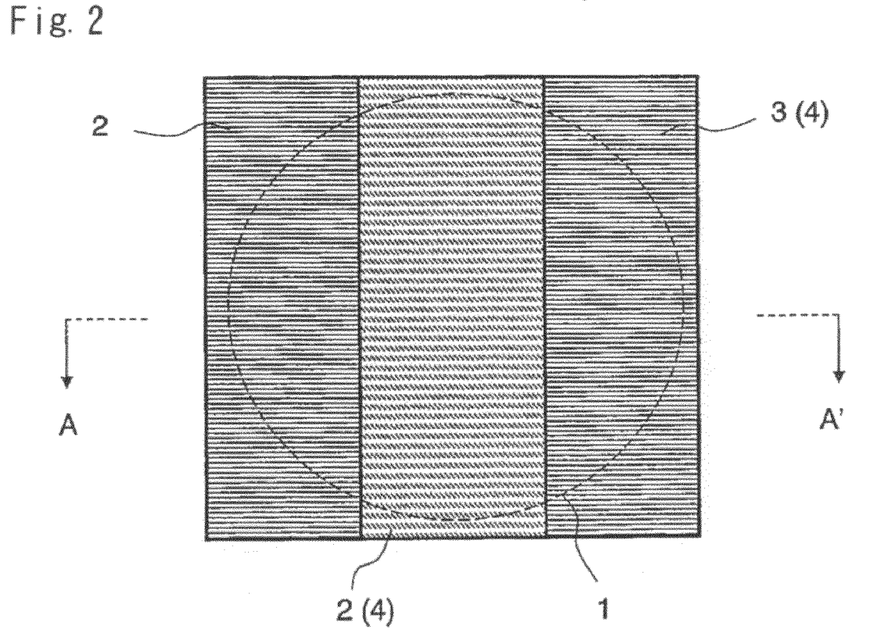
FIG. 2 is an explanatory plan view illustrating a case where a central electrostatic chuck and peripheral electrostatic chucks form the substrate chucking surface.

That is, as shown in FIG. 1, as a first structural example, there can be exemplified a foreign material removing apparatus in which an electrostatic chuck forming a substrate chucking surface is divided into at least a central electrostatic chuck 2 for attracting a central portion of a substrate 1 and a peripheral electrostatic chuck 3 for attracting a peripheral portion of the substrate. That is, a plurality of electrostatic chucks including at least the central electrostatic chuck 2 and the peripheral electrostatic chuck 3 form a substrate chucking surface 4. The substrate 1 is attracted to the substrate chucking surface 4 through a resin sheet supplied from a resin sheet supplying means and the foreign materials deposited on a substrate chucking surface side of the substrate 1 are removed. Such a structure is preferably employed that the central electrostatic chuck 2 corresponds to at least the central portion of the substrate and the peripheral electrostatic chuck 3 corresponds to the peripheral portion of the substrate, thereby being capable of attracting a single substrate. Thus, for example, as shown in FIG. 2, such a structure may be employed that peripheral electrostatic chucks are located on both sides of a central electrostatic chuck sandwiched therebetween. The shapes of the electrostatic chucks are not limited to those shown in FIGS. 1 and 2 and thus can be designed as appropriate based on a size of the substrate to be attracted, a shape thereof, and the like. For example, each of the electrostatic chucks may have a rectangular shape, a circular shape, or another shape.

When the electrostatic chuck is divided into the central electrostatic chuck and the peripheral electrostatic chuck, the foreign material removing apparatus preferably includes a height direction adjustment means capable of protruding the central electrostatic chuck in a direction perpendicular to the substrate chucking surface with respect to the peripheral electrostatic chuck to form a predetermined gap between an end portion of the substrate and the resin sheet. When a plurality of electrostatic chucks forming the substrate chucking surface are provided such that at least one of the electrostatic chucks can be moved upward and downward, the substrate can be easily attached and collected. That is, when the substrate is attracted to the substrate chucking surface to remove the foreign materials and then a height of the central electrostatic chuck is relatively increased by the height direction adjustment means to form the predetermined gap between the end portion of the substrate and the resin sheet, the substrate from which the foreign materials are removed can be easily collected because the predetermined gap is formed between the end portion of the substrate and the resin sheet. The predetermined gap formed between the end portion of the substrate and the resin sheet is preferably a gap with the use of which the substrate can be collected by a substrate transfer means as described later.

To be specific, the height direction adjustment means preferably includes a peripheral chuck lifting mechanism capable of moving the peripheral electrostatic chuck from the substrate chucking surface downward in the perpendicular direction, and a resin sheet height adjustment mechanism capable of adjusting a height position of at least a part of the resin sheet which corresponds to the peripheral electrostatic chuck to a level lower than the substrate chucking surface. Therefore, the central electrostatic chuck may be relatively protruded to form the predetermined gap between the end portion of the substrate and the resin sheet. Alternatively, the height direction adjustment means includes a central chuck lifting mechanism capable of moving the central electrostatic chuck from the substrate chucking surface upward in the perpendicular direction. Therefore, the central electrostatic chuck may be relatively protruded to form the predetermined gap between the end portion of the substrate and the resin sheet. The peripheral chuck lifting mechanism and the central chuck lifting mechanism are not particularly limited if the chuck lifting mechanisms can lift the respective electrostatic chucks. For example, an air cylinder, a solenoid, a ball screw and nut driven by a motor, or the like is preferably connected to the respective electrostatic chucks such that the electrostatic chucks can be lifted. The resin sheet height adjustment mechanism may be provided with, for example, a guide roller connected to the lifting mechanism as described above. Note that the upward and downward directions relative to the substrate chucking surface mean that the substrate side relative to the substrate chucking surface corresponds to the upward side and the opposite side relative thereto corresponds to the downward side.

The foreign material removing apparatus according to the present invention includes a substrate transfer means. The substrate transfer means is preferably a means capable of supplying the substrate to be processed to the electrostatic chuck and collecting the processed substrate from the electrostatic chuck. When the electrostatic chuck includes the central electrostatic chuck and the peripheral electrostatic chuck, a substrate holding portion capable of holding the substrate with the use of the gap formed between the end portion of the substrate and the resin sheet by the height direction adjustment means is preferably provided to a tip end of the substrate transfer means. Because the substrate holding portion is provided, the supply of the substrate to be processed and the collection of the processed substrate can be reliably and easily performed. To be specific, the substrate transfer means is preferably a robot arm including a holding portion capable of holding the end portion of the substrate or a robot arm including a fork which can be inserted into the gap formed between the substrate and the resin sheet to mount and collect the substrate. The robot arm which can be employed is a robot arm normally used for, for example, the transfer of the substrate. That is, in order to be able to supply the substrate to the electrostatic chuck and collect the substrate therefrom, a mechanism which can be moved in x-y directions is preferably provided. If necessary, a lifting mechanism capable of lifting up and down the substrate relative to the substrate chucking surface in the perpendicular direction is preferably provided. The function of the substrate transfer means may be divided into a supply function and a collection function to provide respective separate substrate transfer means.

The foreign material removing apparatus may further include a substrate lift-up means which can be inserted into the gap formed between the substrate and the resin sheet by the height direction adjustment means to lift up the substrate. The processed substrate is more reliably and easily collected by the robot arm including the holding portion or the fork. The substrate lift-up means is not particularly limited and an example thereof can include a push-up pin capable of pushing up the substrate from substrate chucking surface. When the substrate is supplied to the electrostatic chuck, the operation reverse to the substrate collection operation is desirably performed. That is, the substrate is placed on the substrate lift-up means and supplied onto the resin sheet laid on the central electrostatic chuck protruded by the height direction adjustment means. In this case, when the substrate lift-up means is not provided, the substrate is preferably directly supplied to the central electrostatic chuck. Then, the central electrostatic chuck and the peripheral electrostatic chucks are preferably adjusted in height by the height direction adjustment means to form the substrate chucking surface and applied with voltages to attract the substrate.

In the present invention, the substrate is attracted to the substrate chucking surface through the resin sheet and the foreign materials deposited on the substrate chucking side of the substrate are transferred to the resin sheet to remove the foreign materials. The resin sheet to be used is preferably made of a material softer than at least the substrate to be attracted. In general, an uppermost surface of the electrostatic chuck (that is, the substrate chucking surface) is required to be a hard surface. For example, when the uppermost surface is made of ceramics such as alumina, silicon carbide, or aluminum nitride, Knoop hardness thereof is approximately 2000 Hk (e.g., 2500 Hk in the case of silicon carbide and 2100 Hk in the case of alumina). On the other hand, the Knoop hardness of the silicon wafer is normally approximately 960 Hk. Of constituent compositions of foreign materials such as dust or particles, iron, which may be the most undesirable in view of semiconductor manufacturing, has Knoop hardness of approximately 300 Hk. Therefore, it is preferable to use a resin sheet whose Knoop hardness is 20 Hk to 200 Hk. In particular, when the substrate to be attracted is a glass substrate used for a liquid crystal device or the like, the Knoop hardness thereof is approximately 315 Hk and equal to the hardness of iron which is a foreign material, so it is more preferable to use a resin sheet whose Knoop hardness is 20 Hk to 100 Hk. When the substrate is attracted through such a resin sheet, the foreign materials deposited on the substrate chucking surface side can be transferred to the resin sheet side and removed. The resin sheet does not particularly require an adhesive surface. Therefore, a force applied to the substrate is equal to the chucking force of the electrostatic chuck used for a normal semiconductor manufacturing apparatus, with the result that the force applied to the substrate at the time of removal can be reduced to zero in principle as compared with the case where an adhesive tape is used for conventional foreign material removal. Thus, the foreign materials can be removed from, for example, a next-generation wafer having a large diameter of 450 mm in addition to a semiconductor wafer having a diameter of 300 mm which is a current mainstream without any damage to the substrate.

Material examples of the resin sheet can include polyvinyl alcohol, low-density polyethylene, polyethylene, polyvinylidene chloride, polyvinyl chloride, polypropylene, polyethylene terephthalate, acetyl cellulose, polycarbonate, nylon, polyimide, aramid, and polycarbodiimide. Of those, polyvinyl alcohol, low-density polyethylene, polyethylene, polyvinylidene chloride, polyvinyl chloride, polypropylene, and polyethylene terephthalate are preferable in view of a low cost. In addition to the above, a rubber material such as a silicon rubber can be used. A thickness of the resin sheet is preferably 5 µm to 100 µm, more preferably 5 µm to 30 µm. This is because, when the thickness is larger than 100 µm, the chucking force of the electrostatic chuck becomes smaller. In contrast to this, when the thickness is smaller than 5 µm, the resin sheet is difficult to treat and likely to rupture. It is, as a matter of course, necessary to manufacture the resin sheet in a particle-controlled environment.

Incidentally, when a volume resistance value of the resin sheet reduces, there is a case where the substrate is further strongly attracted to the electrostatic chuck, in particular, a case where the electrostatic chuck exercises a Johnsen-Rahbek force. That is, a small current from the electrode of the electrostatic chuck flows to the substrate through the periphery of the electrode and the substrate chucking surface to generate a large electrostatic chucking force in a small gap between the substrate and the substrate chucking surface. Therefore, the resin sheet made of the above-mentioned material exhibits a high electrical insulating property (volume resistance is in a range of $10^{15}$ Ω·cm to $10^{18}$ Ω·cm). For example, when the resin sheet to be used is mixed with a conductive filler to set the volume resistance value in a range of approximately $10^9$ Ω·cm to $10^{13}$ Ω·cm, the chucking force of the electrostatic chuck to the substrate can be increased.

The resin sheet supplying means is not particularly limited when it can supply, for example, a sheet-shaped resin sheet or a resin sheet wound in a roll shape to the substrate chucking surface. The resin sheet supplying means preferably includes a delivery roll around which the resin sheet is wound in a roll shape, supply side guide rollers for guiding the resin sheet delivered from the delivery roll to the substrate chucking surface side. The resin sheet collecting means is not particularly limited when it can collect the resin sheet supplied to the substrate chucking surface. The resin sheet collecting means preferably includes a wind-up roll for winding up the resin sheet and collection side guide rollers for guiding the resin sheet fed from the substrate chucking surface to the wind-up roll side. The resin sheet supplying means and the resin sheet collecting means are made adaptable to the roll-shaped resin sheet, so a flat area (occupied area) occupied by the foreign material removing apparatus can be reduced in size. An unused resin sheet can be supplied to the substrate chucking surface while the used resin sheet to which the foreign materials are transferred on the substrate chucking surface is collected, so the processings for removing the foreign materials from the substrates can be successively performed. That is, when unused resin sheets are successively supplied for each substrate based on the amount of deposition of the foreign materials, the removal of the foreign materials can be repeated a plurality of times. When the substrate from which the foreign materials are removed once is collected by the substrate transfer means and a new substrate is supplied to remove the foreign materials, a plurality of substrates can be successively processed.

In the present invention, a normal electrostatic chuck can be used as the electrostatic chuck forming the substrate chucking surface. It is preferable to use a bipolar electrostatic chuck including two electrodes to which voltages whose potentials are different from each other are applied. That is, when the central electrostatic chuck and the peripheral electrostatic chuck form the substrate chucking surface, each of the electrostatic chucks is preferably the bipolar electrostatic chuck.

With respect to the electrostatic chuck, electrodes of the electrostatic chuck may form the substrate chucking surface. That is, the substrate chucking surface may be composed of electrodes of the central electrostatic chuck and electrodes of the peripheral electrostatic chuck. In general, in order to ensure insulation between the substrate and the electrodes, the electrostatic chuck includes an insulating dielectric layer made of a dielectric material having an electrical insulating property and the insulating dielectric layer forms the substrate chucking surface (uppermost surface) of the electrostatic chuck. In addition to the function for ensuring the electrical insulation, the insulating dielectric layer has a function for protecting the electrodes from mechanical damage and a function for preventing the generation of metal contamination from the electrodes. In the present invention, when the resin sheet has an electrical insulating property, the resin sheet can also serve as an insulating dielectric layer for a normal electrostatic chuck. Therefore, the electrodes of the electrostatic chuck may be exposed to the uppermost surface such that the electrodes form the substrate chucking surface. When the electrodes may be exposed to the uppermost surface of the electrostatic chuck to form the substrate chucking surface, the chucking force exercised by the electrostatic chuck can be improved because a distance between the substrate and the electrodes shortens. Thus, even in the case of a low voltage, the same chucking force can be obtained to reduce a power supply cost, thereby suppressing the generation of unnecessary electrostatic. In addition, a problem that discharging or short-circuit of the electrodes may be caused by a high voltage can be minimized.

When the electrodes form the substrate chucking surface, each electrode is preferably an elastic electrode whose Shore hardness is 20 Hs to 90 Hs and volume resistivity is 100 Ω·cm to $1\times10^{-5}$ Ω·cm. The volume resistivity is more preferably set in a range of $1\times10^{-2}$ Ω·cm to $1\times10^{-5}$ Ω·cm.

An example of the electrode having the above-mentioned properties can include a silicon rubber mixed with a conductive filler such as carbon or a carbon nanotube. In addition, for example, a fluorine-based, nitrile-based, or phlorosilicon-basd rubber can be used as a material of the rubber. The silicon rubber is preferable in view of a reduction in influence of contamination on the substrate which is an object to be attracted. The hardness of a rubber is normally expressed by Shore hardness. The Shore hardness of approximately 20 Hs corresponds to substantially the softness of human skin. The Shore hardness of 90 Hs elicits a very hard feeling. Materials of a silicon wafer, a glass substrate, and the like are not normally expressed by the Shore hardness, but the rubber may be several orders of magnitude harder than the materials. Therefore, the above-mentioned range is preferable in order to exercise sufficient flexibility to the substrate to be attracted. The volume resistivity of the electrode is preferably a lower value. However, in order to obtain the electrode having flexibility, it is necessary to mix the rubber with the conductive filler. Thus, the above-mentioned range is desirable. The reason why the electrodes are made of a material having electrical conductivity is that, as a matter of course, the same potential is provided to all parts when a voltage is supplied to the electrodes.

When the electrodes form the substrate chucking surface, a thickness (electrode depth direction) of each of the electrodes is preferably in a range of 0.05 mm to 3 mm, and more preferably in a range of 0.2 mm to 3 mm. The flexibility of the electrode and the thickness thereof are associated with each other, and a thin electrode is not excellent in flexibility. In contrast, a thick electrode causes an increase in cost. In addition, the thickness is likely to significantly change because of the flexibility, so a problem occurs in view of the relationship with the substrate transfer means when the substrate is supplied and collected or it is likely to cause a problem on a substrate transfer system. Therefore, the above-mentioned thickness is desirable in view of the above circumstances.

The elastic electrodes form the substrate chucking surface, so the foreign materials deposited on the substrate can be more reliably transferred to the resin sheet and removed. The electrodes forming the substrate chucking surface has some degree of flexibility corresponding to the above-mentioned Shore hardness, with the result that the degree of contact of the substrate to the substrate chucking surface can be further improved and the foreign materials can be easily transferred to the resin sheet. For example, a silicon wafer whose diameter is 200 mm normally has a warp or distortion of approximately 20 μm and local unevenness of approximately several μm. Therefore, when the substrate chucking surface (uppermost surface) of the electrostatic chuck has a hardness equal to that of ceramics, it is difficult to bring the entire surface of the wafer into contact with the substrate chucking surface by only the chucking force of the electrostatic chuck. In particular, when foreign materials such as particles are deposited on the rear surface of the silicon wafer, the contact of the substrate may be hindered by the presence of the particles. Thus, the substrate is attracted to the substrate chucking surface including the elastic electrodes through the resin sheet to solve the problems, so the foreign materials can be more reliably removed from the entire surface of the substrate. The elastic electrodes have an excellent impact resistance and can be restored by leaving from the substrate even when the adaptable elastic electrodes are temporarily deformed along the shape of the substrate, so elastic electrodes can immediately adaptable to another substrate to be attracted.

When the substrate is to be separated from the resin sheet after the removal of the foreign materials, removal charging may be caused between the substrate and the resin sheet by contact. When the substrate or the resin sheet is charged, it is likely that the foreign materials transferred to the resin sheet are left from the resin sheet by static and deposited on the substrate side again. Therefore, a device for neutralizing static, such as an ionizer, may be attached to the foreign material removing apparatus to blow positive or negative ions which are neutralization particles between the substrate and the resin sheet or between the resin sheet and the electrostatic chuck. When the neutralization particles are blown, the surface of the resin sheet is activated. Thus, it is expected that the foreign materials are more easily attracted to the resin sheet to improve a foreign material removal effect.

As a second structural example of the foreign material removing apparatus according to the present invention, there can be exemplified a foreign material removing apparatus which has at least two electrostatic chucks including a first electrostatic chuck forming a first substrate chucking surface and a second electrostatic chuck forming a second substrate chucking surface. That is, two or more substrate chucking surfaces are provided to form a plurality of chucking stages, so the operations for removing the foreign materials from the substrate can be simultaneously performed corresponding to the number of stages (the number of electrostatic chucks). Therefore, the processing capability of the apparatus can be improved and a foreign material removal effect can be further completely obtained in the case where one-time removal processing is insufficient. Unless otherwise specified, the description of the first structural example of the foreign material removing apparatus can be applied to the second structural example of the apparatus. Hereinafter, as the foreign material removing apparatus including a plurality of electrostatic chucks each having a separate substrate chucking surface, the foreign material removing apparatus including two electrostatic chucks will be described. However, the present invention is not limited to this case and thus three or more electrostatic chucks (third electrostatic chuck or the like) may be included.

When the foreign material removing apparatus includes at least the first electrostatic chuck and the second electrostatic chuck, a substrate rotating means capable of adjusting an orientation of the substrate in a direction parallel to the substrate chucking surface is preferably provided. When the orientation of the substrate from which the foreign materials are removed by the first electrostatic chuck is changed and the substrate is supplied to the second electrostatic chuck by the substrate transfer means, the deposited foreign materials can be more reliably removed from the entire surface of the substrate. That is, in the case where electrodes of the first electrostatic chuck are projected to the substrate side attracted to the first substrate chucking surface, when there is a substrate non-chucking area in which the substrate does not overlap with the projected electrodes, the orientation of the substrate is adjusted by the substrate rotating means such that the entire non-chucking area is included in an electrode projection area obtained by projecting electrodes of the second electrostatic chuck to the substrate side. Then, the foreign materials are removed by the second electrostatic chuck. Thus, the foreign materials can be removed from the entire surface of the substrate.

For example, when the substrate is attracted to the substrate chucking surface of the electrostatic chuck such that an end portion of the substrate becomes a margin, the substrate can be reliably and accurately supplied and collected by the substrate transfer means with the use of the end portion. That is, the substrate is preferably attracted to the first substrate chucking surface such that the non-chucking area of the substrate in which the substrate does not overlap with the projected electrodes of the first electrostatic chuck which are projected to the substrate side attracted to the first substrate chucking surface includes the end portion of the substrate. In addition, the substrate transfer means preferably includes a robot arm having a holding portion capable of holding the end portion of the substrate. Similarly, the substrate is preferably attracted to the second substrate chucking surface such that the non-chucking area of the substrate in which the substrate does not overlap with the projected electrodes of the second electrostatic chuck which are projected to the substrate side attracted to the second substrate chucking surface includes the end portion of the substrate. In addition, the substrate transfer means preferably includes a robot arm having a holding portion capable of holding the end portion of the substrate. According to such a structure, unlike the first structural example, the substrate can be easily and reliably supplied and collected without providing the height direction adjustment means and the substrate lift-up means.

When each of the first electrostatic chuck and the second electrostatic chuck is a bipolar electrostatic chuck having two electrodes to which voltages whose potentials are different from each other are applied, an area corresponding to an interval between the two electrodes of the first electrostatic chuck is a non-chucking area of the substrate in which the substrate does not overlap with the projected two electrodes which are projected to the substrate side attracted to the first substrate chucking surface. Therefore, the orientation of the substrate is preferably adjusted by the substrate rotating means such that the non-chucking area of the substrate is included in an electrode projection area obtained by projecting the two electrodes of the second electrostatic chuck to the substrate side. Then, the foreign materials are preferably removed by the second electrostatic chuck. When the substrate is attracted such that the end portion thereof becomes a margin, the substrate transfer means suitably includes the robot arm having the holding portion capable of holding the end portion of the substrate.

The resin sheet which can be used is the same as that described in the first structural example. The resin sheet supplying means and the resin sheet collecting means are the same as those described in the first structural example. The resin sheet supplying means suitably includes a delivery roll around which the resin sheet is wound in a roll shape and supply side guide rollers for guiding the resin sheet delivered from the delivery roll to the first substrate chucking surface side. The resin sheet collecting means suitably includes a wind-up roll for winding up the resin sheet and collection side guide rollers for guiding the resin sheet fed from the second substrate chucking surface to the wind-up roll side.

The first substrate chucking surface may include the electrodes of the first electrostatic chuck. Similarly, The second substrate chucking surface may include the electrodes of the second electrostatic chuck. That is, even in the second structural example, as described in the first structural example, the resin sheet can also serve as an insulating dielectric layer for a normal electrostatic chuck. Therefore, the electrodes of each of the electrostatic chucks can form the substrate chucking surface. In this case, with respect to the electrodes forming the substrate chucking surface, each electrode is preferably an elastic electrode whose Shore hardness is 20 Hs to 90 Hs and volume resistivity is 100 Ω·cm to $1\times10^{-5}$ Ω·cm. The thickness thereof is preferably in a range of 0.05 mm to 3 mm, and more preferably in a range of 0.2 mm to 3 mm. The volume resistivity is more preferably set in a range of $1\times10^{-2}$ Ω·cm to $1\times10^{-5}$ Ω·cm.

In each of the first and second structural examples, a time period for which the substrate to the electrostatic chuck is attracted is normally set to 1 to 60 seconds depending on a size and an amount of foreign materials deposited on the substrate, so the foreign materials can be transferred to the resin sheet side. When a foreign material amount per unit area is large, it is effective to lengthen the chucking time. When the electrostatic chuck used for the apparatus is the bipolar electrostatic chuck, the chucking force can be adjusted by changing the voltages applied to the electrodes. Therefore, under a condition in which the foreign material amount is small, the voltages are reduced or the chucking time is shortened, so the electrostatic chuck is adaptable to the condition. In addition, operation parameters for minimizing a processing time per substrate can be optimized. In this case, the chucking force to the substrate per unit area is desirably in a range of 10 gf/cm$^2$ to 300 gf/cm$^2$.

The foreign material removing apparatus according to the present invention is not necessarily operated particularly in a vacuum and thus can be used in an atmospheric pressure or a slightly increased pressure. Thus, a procedure for vacuuming or exposure to air is omitted, so the processing time of the apparatus can be shortened.

Effects of the Invention

According to the foreign material removing apparatus of the present invention, the foreign materials deposited on the substrate (foreign materials deposited on the substrate chucking surface side) are transferred to the resin sheet and then the resin sheet is collected, so it is possible to eliminate the chance of redeposition of the removed foreign material to the substrate as much as possible. Further, the foreign materials are removed without using the adhesive or the like, so a load applied to the substrate at the time of removal, which is a conventional problem, is substantially zero, the apparatus is adaptable to a substrate whose size is increased, and there is no chance of damaging the substrate. In addition, when the roll-shaped resin sheet is used, successive processing is more significantly effectively performed. Therefore, in particular, the use of the apparatus in, for example, a semiconductor devices manufacturing site in which higher processing capability is required is effective. Further, when the potentials applied to the electrostatic chuck, the chucking time, and the like are optimized as parameters based on the amount or the size of foreign materials deposited on the substrate, the foreign materials can be effectively removed, with the result that a necessary processing time per substrate can be minimized.

Still further, because a low-cost resin sheet is used, a maintenance cost can be suppressed to a low cost.

DESCRIPTION OF REFERENCE NUMERALS

X: foreign material removing apparatus, 1: substrate, 2: central electrostatic chuck, 3: peripheral electrostatic chuck, 4: substrate chucking surface, 5: resin sheet, 6: delivery roll, 7: supply side guide roller, 8: supply side adjustment roller, 9: resin sheet supplying means, 10: wind-up roll, 11: collection side guide roller, 12: collection side adjustment roller, 13: resin sheet collecting means, 14, 18, 20: first electrode, 15, 19, 21: second electrode, 16: power supply, 17: switch, 22: foreign material, 23: substrate push-up pin, 24: fork, 25: robot arm, 26: supply substrate cassette, 27: collection substrate cassette, 31, 34, 37: first electrode, 31, 34, 37, 32, 35, 38: second electrode, 33, 36, 38: metal base, 41: first electrostatic chuck, 42: second electrostatic chuck, 43: first electrode, 44: second electrode, 45: first substrate chucking surface, 46: first electrode, 47: second electrode, 48: second substrate chucking surface, 49: clean air ionizer, 50: robot arm, 51: aligner, 52: SMIF

BEST MODE FOR CARRYING OUT THE INVENTION

Hereinafter, preferred embodiment modes of the present invention will be specifically described with reference to the attached drawings.

A foreign material removing apparatus in a case where an electrostatic chuck forming a substrate chucking surface is divided into a central electrostatic chuck and peripheral electrostatic chucks will be specifically described.

Figure 3:
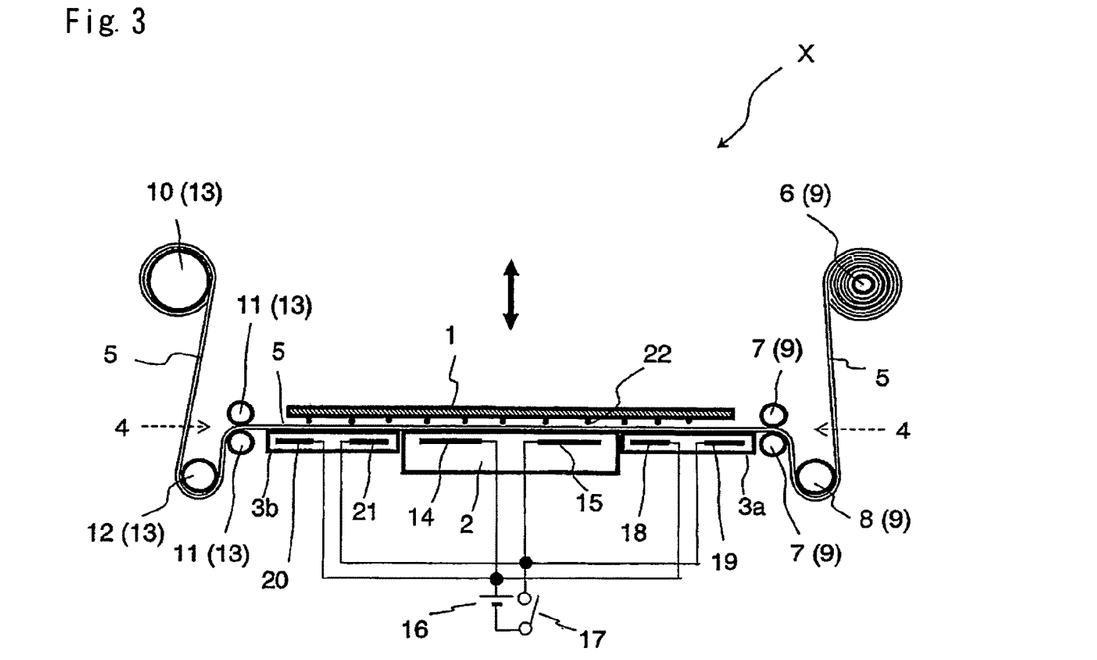
FIG. 3 is an explanatory cross sectional (partial) view showing a foreign material removing apparatus in the case where the central electrostatic chuck and the peripheral electrostatic chucks form the substrate chucking surface.

FIG. 3 is a partial cross sectional view (A-A' cross section in FIG. 2) showing a foreign material removing apparatus X having a substrate chucking surface 4 including a central electrostatic chuck 2 and peripheral electrostatic chucks 3 shown in FIG. 2. That is, in the foreign material removing apparatus X, the substrate chucking surface 4 whose two-dimensional shape is a rectangular shape includes the central electrostatic chuck 2 which has a relatively wide portion and corresponds to a center portion of the substrate 1 and peripheral electrostatic chucks 3a and 3b which are located on both sides of the central electrostatic chuck 2 and correspond to a peripheral portion of the substrate 1. A resin sheet 5 which has a thickness of 10 μm and is made of polyvinyl alcohol is laid on the substrate chucking surface 4. The resin sheet 5 is supplied to the substrate chucking surface 4 by a resin sheet supplying means 9 such that the peripheral electrostatic chuck 3a, the central electrostatic chuck 2, and the peripheral electrostatic chuck 3a are located in this order in a resin sheet length direction. The resin sheet supplying means 9 includes a delivery roll 6 around which the resin sheet 5 is wound in a roll shape, a pair of supply side guide rollers 7 for guiding the resin sheet 5 delivered from the delivery roll 6 to the substrate chucking surface 4 side, and a supply side adjustment roller 8 located between the delivery roll 6 and the supply side guide rollers 7 to adjust the tension of the resin sheet 5. The resin sheet 5 supplied to the substrate chucking surface 4 is collected by a resin sheet collecting means 13 which includes a wind-up roll 10, a pair of collection side guide rollers 11 for guiding the resin sheet 5 fed from the substrate chucking surface 4 to the wind-up roll 10 side, and a collection side adjustment roller 12 located between the wind-up roll 10 and the collection side guide rollers 11 to adjust the tension of the resin sheet 5.

The central electrostatic chuck 2 and the two peripheral electrostatic chucks 3a and 3b each are a bipolar electrostatic chuck. The central electrostatic chuck 2 includes two electrodes, a first electrode 14 and a second electrode 15. The first electrode 14 and the second electrode 15 are connected with a power supply 16 and connected in series with a switch 17 for turning ON/OFF a voltage of the power supply 16. Similarly, a first electrode 18 and a second electrode 19 of the peripheral electrostatic chuck 3a and a first electrode 20 and a second electrode 21 of the peripheral electrostatic chuck 3b each are connected with the power supply 16 through the switch 17. The peripheral electrostatic chucks 3a and 3b are connected with a lifter mechanism (height direction adjustment means) which is not shown and can move the peripheral electrostatic chucks 3a and 3b upward and downward in the direction perpendicular to the substrate chucking surface 4 (direction indicated by a double-headed arrow in FIG. 3). The supply side guide rollers 7 and the collection side guide rollers 11 are connected with the same lifter mechanism (height direction adjustment means) which is not shown. A robot arm (not shown) including a fork for carrying the substrate 1 is provided to supply the substrate 1 to be processed to the substrate chucking surface 4 and collect the processed substrate 1.

Figure 4:
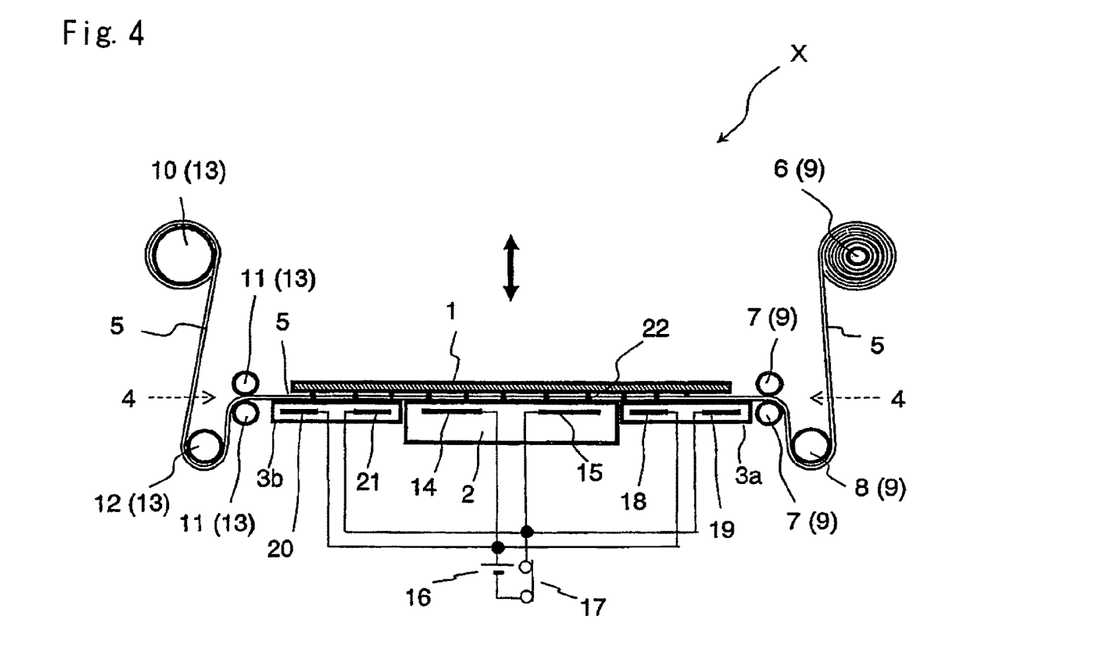
FIG. 4 is an explanatory cross sectional view showing a state in which a substrate is attracted to the foreign material removing apparatus.

A procedure for removing foreign materials from the substrate 1 using the foreign material removing apparatus X having the above-mentioned structure will be described. FIG. 3 shows a state in which the substrate 1 (in which foreign materials 22 are deposited on the substrate chucking surface side) supplied by the robot arm (substrate transfer means) which is not shown is placed on the resin sheet 5 on the substrate chucking surface 4. At this time, the switch 17 for the power supply 16 is in an OFF state. Therefore, a voltage is not applied to any of the electrostatic chucks and thus the substrate 1 is not attracted. FIG. 4 shows a state in which the switch 17 for the power supply 16 is turned ON to simultaneously apply the same voltage between the first electrode and the second electrode of each of the electrostatic chucks, thereby attracting the substrate 1 to the substrate chucking surface 4 through the resin sheet 5. In this state, the foreign materials 22 are captured in the resin sheet 5. A chucking time and the voltage of the power supply 16 can be adjusted. For example, the chucking time can be adjusted within a range of 1 second to 60 seconds and the interterminal voltage of the power supply 16 can be adjusted within a range of 0 to 8 kV. In particular, in a case of a bipolar electrostatic chuck, positive and negative potentials can be applied between terminals, so a potential difference of the voltage is within a range of 0 to ±4 kV. Note that all mechanisms such as the respective electrostatic chucks and the rollers, the power supply, the switch, and the like may be controlled by a controller which is not shown, for controlling the operations of those.

Figure 5:
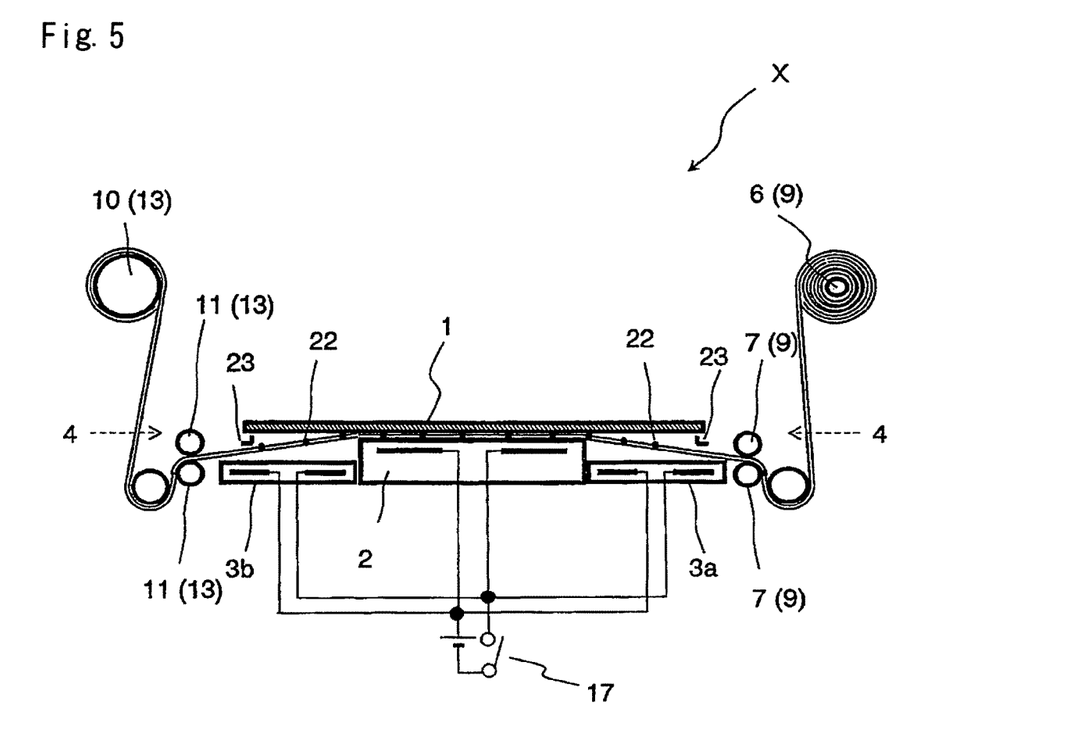
FIG. 5 is an explanatory cross sectional view showing a state in which the central electrostatic chuck is protruded by a height direction adjustment means to form a gap between an end portion of the substrate and a resin sheet.

The substrate 1 is attracted for a predetermined time in the above-mentioned set conditions and then the switch 17 is turned OFF. After that, as shown in FIG. 5, the central electrostatic chuck 2 is protruded by the height direction adjustment means relative to the peripheral electrostatic chucks 3a and 3b in the direction perpendicular to the substrate chucking surface 4 to form a gap between an end portion of the substrate 1 and the resin sheet 5. That is, the peripheral electrostatic chucks 3a and 3b, the supply side guide rollers 7, and the collection side guide rollers 11, each of which is provided with the lifter mechanism which is not shown, are moved from the substrate chucking surface 4 downward in the perpendicular direction (opposite side to the substrate chucking surface 4), so the state shown in FIG. 5 can be obtained. With the use of the gap formed between the substrate 1 and the resin sheet 5, the substrate 1 can be collected by the robot arm. With this state, when substrate push-up pins 23 (substrate lift-up means) are inserted from both sides of the substrate 1 into the gap to lift the substrate 1 upward in the perpendicular direction, the substrate 1 can be more easily and reliably collected. Note that FIG. 5 shows a state in which the foreign materials 22 deposited on the substrate 1 are transferred to the resin sheet 5.

Figure 6:
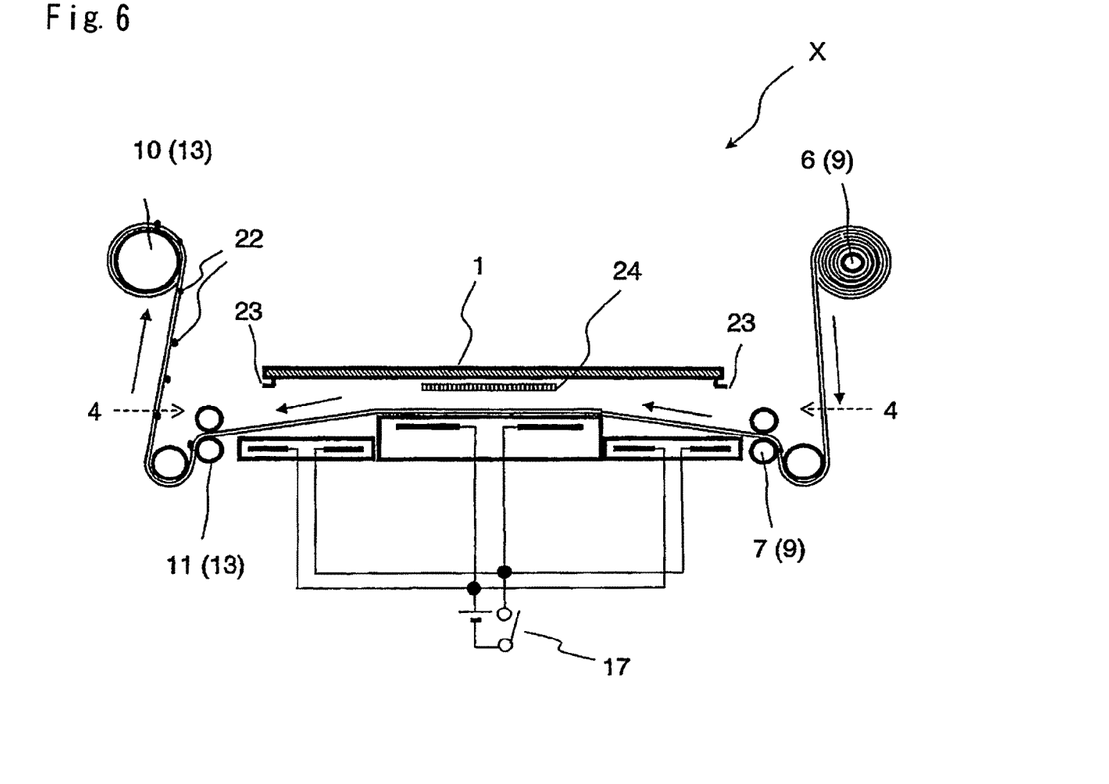
FIG. 6 is an explanatory cross sectional view showing a state in which the substrate from which foreign materials are removed is collected.

As shown in FIG. 6, when the substrate 1 from which the foreign materials 22 are removed is to be collected, it is preferable that a fork 24 provided to a tip end of the robot arm be inserted into the gap between the substrate 1 lifted up by the substrate push-up pins 23 and the resin sheet 5 and the substrate be carried on the fork 24 and collected by the robot arm (not shown). The resin sheet 5 to which the foreign materials 22 are transferred from the substrate chucking surface 4 can be collected by the wind-up roll 10. Simultaneously, a new resin sheet 5 delivered from the delivery roll 6 side can be supplied to the substrate chucking surface 4 (direction indicated by an arrow in FIG. 6) to perform next foreign material removing processing.

In order to process another substrate 1 to which foreign materials 22 are deposited, the substrate 1 carried on the fork 24 is moved onto the substrate push-up pins 23 and placed on the new resin sheet 5 located on the central electrostatic chuck 2 by lowering the substrate push-up pins 23. Then, the peripheral electrostatic chucks 3a and 3b are moved up by the respective lifter mechanisms to form the substrate chucking surface 4 with the central electrostatic chuck 2. At this time, the supply side guide rollers 8 and the collection side guide rollers 11 are preferably moved up by the lifter mechanism together with the moving up. When the resin sheet 5 of the delivery roll 6 is completely exhausted, a new resin sheet 5 is preferably set. The used resin sheet 5 collected by the wind-up roll 10 is preferably discarded.

Figure 7:
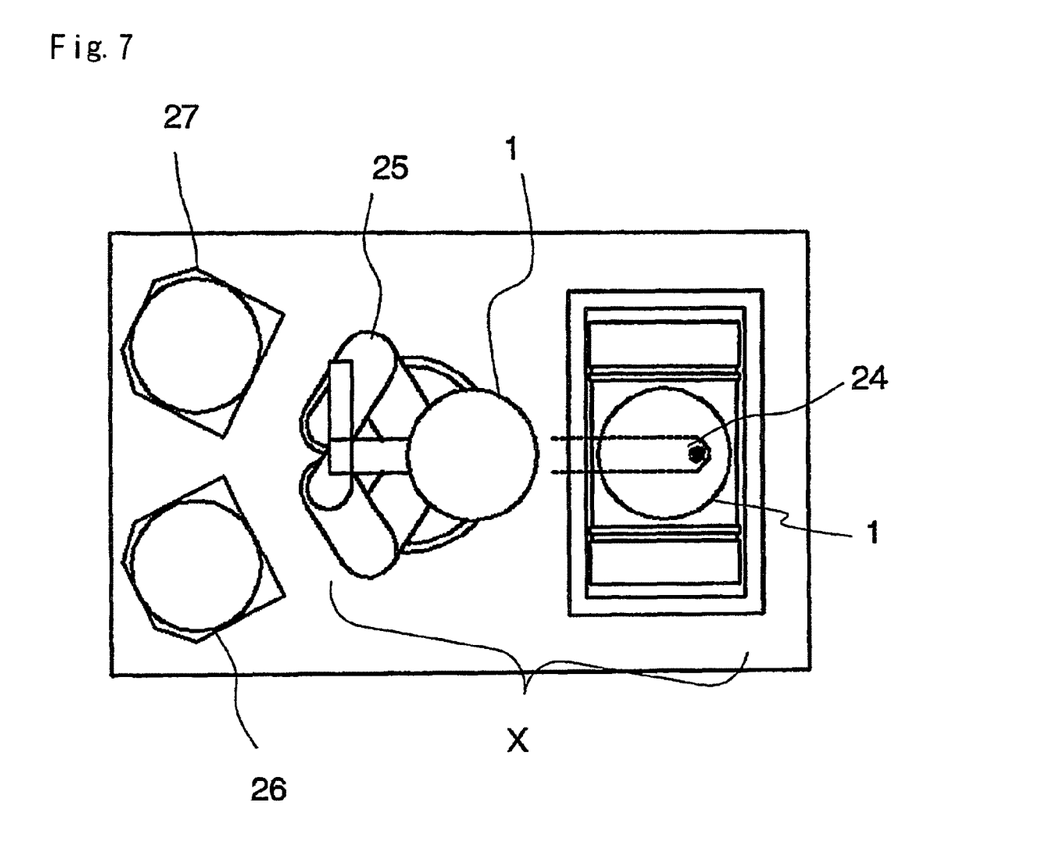
FIG. 7 is an explanatory plan view showing a foreign material removing system in which a supply side substrate cassette and a collection side substrate cassette are combined with the foreign material removing apparatus.
Figure 8:
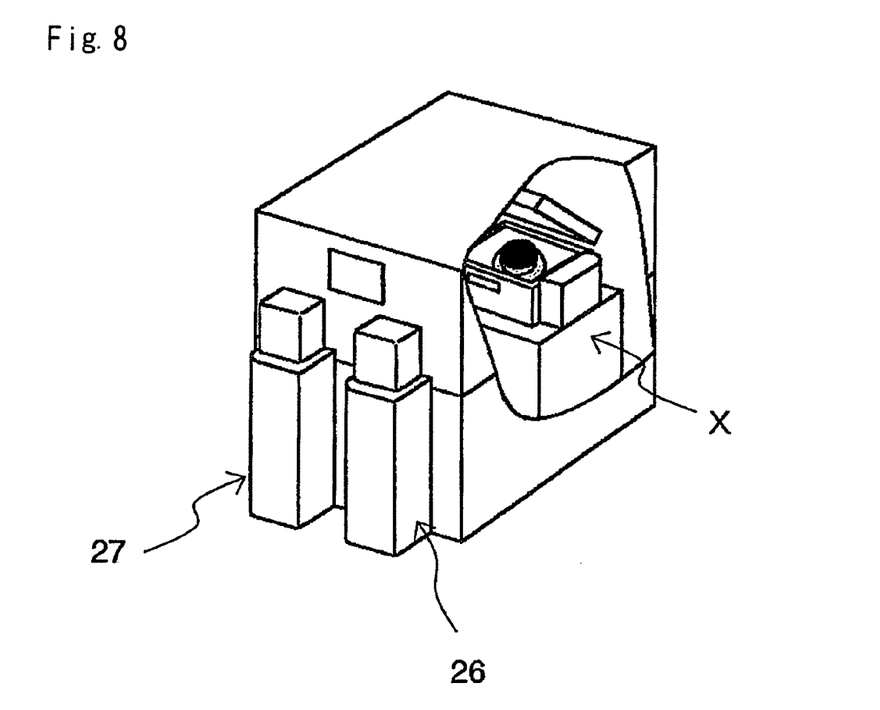
FIG. 8 is an explanatory perspective view (external view) showing the foreign material removing system in which the supply side substrate cassette and the collection side substrate cassette are combined with the foreign material removing apparatus.

As shown in FIG. 7, in addition to the foreign material removing apparatus X according to the present invention, a supply substrate cassette 26 storing the substrate 1 which is unprocessed (before the removal of the foreign materials) and a collection substrate cassette 27 collecting the substrate 1 which is processed (after the removal of the foreign materials) may be arranged within a movable area of a robot arm 25 to construct a foreign material removing system for substrate. FIG. 8 is an external view showing the foreign material removing system constructed to include the foreign material removing apparatus X and the respective substrate cassettes 26 and 27 as described above.

Next, a modified example of the foreign material removing apparatus in which the electrostatic chuck forming the substrate chucking surface is divided into the central electrostatic chuck and the peripheral electrostatic chucks will be specifically described.

Figure 9:
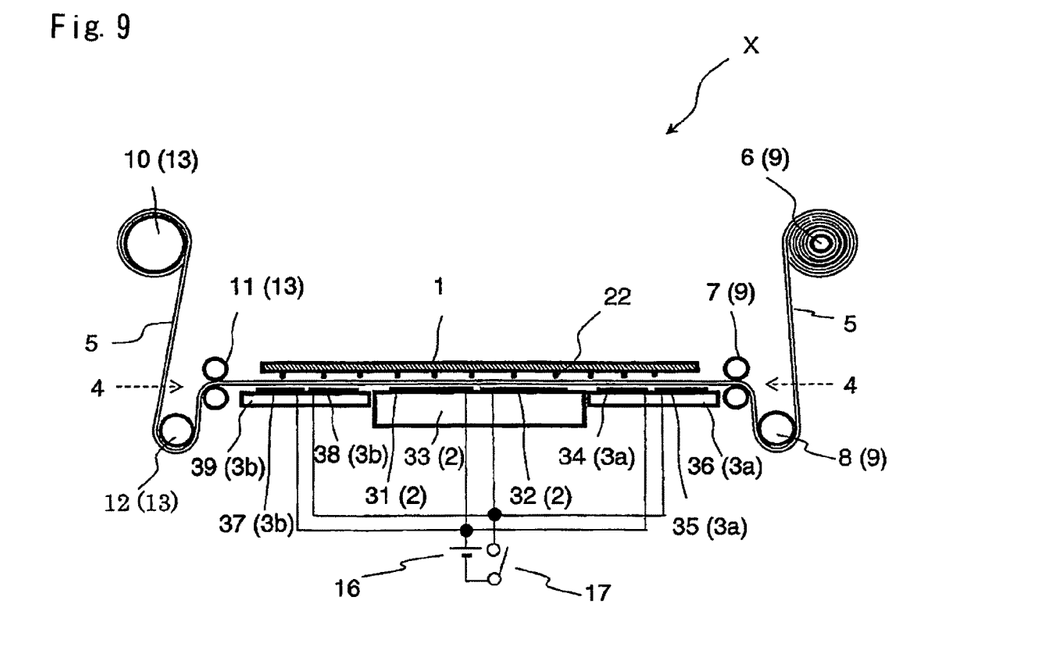
FIG. 9 is an explanatory cross sectional (partial) view showing a modified example of the foreign material removing apparatus in the case where the central electrostatic chuck and the peripheral electrostatic chucks form the substrate chucking surface.

In the foreign material removing apparatus X shown in FIG. 9, an electrode including the central electrostatic chuck 2 and the peripheral electrostatic chucks 3a and 3b forms the substrate chucking surface 4. That is, in the central electrostatic chuck 2, a first electrode 31 and a second electrode 32, each of which has a plate shape and is made of a carbon-contained silicon conductive rubber (elastic electrode) whose thickness is 1 mm, volume resistivity is $1 \times 10^{-4}$ Ω·cm, and Shore hardness is 70 Hs, are bonded to a metal base 33 made of aluminum through an insulating sheet (not shown) which has a thickness equal to or larger than 50 μm and is made of engineering plastic. Similarly, in the peripheral electrostatic chuck 3a, a first electrode 34 and a second electrode 35, each of which has a plate shape and is made of the same conductive rubber, are bonded to a metal base 36 made of aluminum. In the peripheral electrostatic chuck 3b, a first electrode 37 and a second electrode 38, each of which is made of the same conductive rubber, are bonded to a metal base 39 made of aluminum. The first electrodes 31, 34, and 37 and the second electrodes 32, 35, and 38 are exposed to form the substrate chucking surface 4 to which the substrate 1 is attracted. Note that the first electrode and the second electrode are bonded to the insulating sheet using an adhesive and the insulating sheet is bonded to the metal base using an adhesive.

In the modified example, in order to increase a contact ratio with a wafer at the time of chucking, for example, a material of the resin sheet to be used is preferably changed to use the resin sheet 5 made of low-density polyethylene whose thickness is 20 μm. The first electrodes 31, 34, and 37 and the second electrodes 32, 35, and 38 in the respective electrostatic chucks directly form the substrate chucking surface 4, so the same chucking force can be exercised even by an applied voltage lower than that in the above-mentioned example. Therefore, for example, an adjustable range of the chucking time is suitably 1 second to 60 seconds and an adjustable range of the interterminal voltage of the power supply 16 is suitably 0 to 4 kV. In particular, in the case of the bipolar electrostatic chuck, the positive and negative potentials are applied between terminals, so a potential difference of the voltage is within a range of 0 to ±2 kv. Other structures of the apparatus, a foreign material removal procedure, and the like can be made identical to those in the case of the above-mentioned foreign material removing apparatus.

Next, a foreign material removing apparatus including a plurality of chucking stages will be specifically described.

Figure 10:
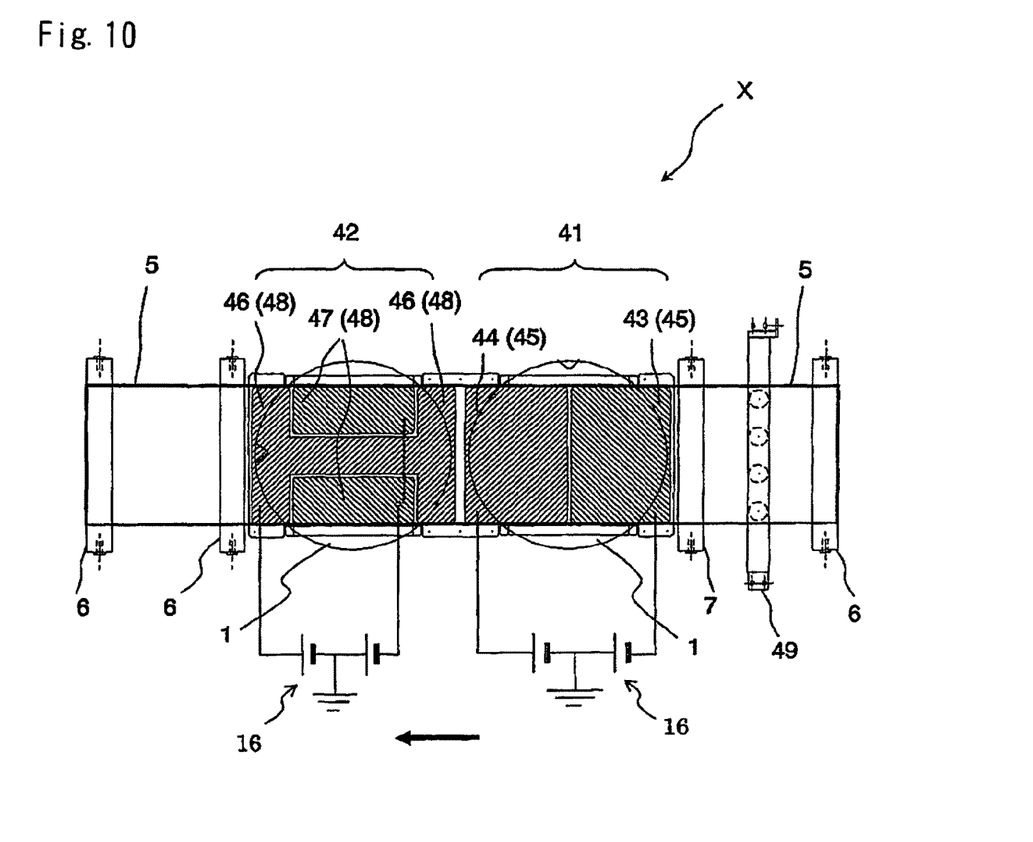
FIG. 10 is an explanatory plan (partial) view showing an example of a foreign material removing apparatus including a first electrostatic chuck and a second electrostatic chuck, each of which forms a substrate chucking surface.

FIG. 10 is an explanatory plan (part) view showing a foreign material removing apparatus X for substrate which has two electrostatic chucks, a first electrostatic chuck 41 forming a first substrate chucking surface 45 and a second electrostatic chuck 42 forming a second substrate chucking surface 48. Each of the first electrostatic chuck 41 and the second electrostatic chuck 42 is the bipolar electrostatic chuck. An electrode made of a carbon-contained silicon conductive rubber (elastic electrode) whose thickness is 1 mm, volume resistivity is $1 \times 10^{-4}$ Ω·cm, and Shore hardness is 70 Hs is bonded onto a metal base made of aluminum through an insulating sheet which has a thickness equal to or larger than 50 μm and is made of polyethylene, thereby forming each of the substrate chucking surfaces. Note that the electrodes of each of the electrostatic chucks are bonded to the insulating sheet using an adhesive and the insulating sheet is bonded to the metal base using an adhesive.

The case where foreign materials are removed from a normal silicon wafer 1 whose diameter is 300 mm will be described below as an example of the substrate 1 to be processed. In the first electrostatic chuck 41, a plane-shaped first electrode 43 whose length is 216 mm and width is 150 mm and a plane-shaped second electrode 44 whose length is 216 mm and width is 150 mm are arranged such that the silicon wafer 1 is divided into two to have an interval of 5 mm. The entire surface of the silicon wafer 1 is not attracted to the first substrate chucking surface 45 including the first electrode 43 and the second electrode 44. Both end portions of the silicon wafer 1 protrude by 30 mm to 40 mm to provide non-chucking areas. A gap portion corresponding to the interval between the first electrode 43 and the second electrode 44 is a substrate non-chucking area. On the other hand, in the second electrostatic chuck 42, a first electrode 46 which has an H-type plane shape and is 310 mm long in a feeding direction of the resin sheet 5 described later and 216 mm wide in a width direction thereof is provided. Two second electrodes 47, each of which has a plane-shape and is 70 mm long and 200 mm wide, are arranged to fill two space portions of the first electrode 46 of the H-type and to have an interval of 5 mm with the first electrode 46. In each of the first electrostatic chuck 41 and the second electrostatic chuck 42, the power supply 16 is connected between the first electrode and the second electrode(s).

The resin sheet 5 which has a thickness of 20 μm to 40 μm and a width of 220 mm to 230 mm and is made of polyethylene is supplied to the first electrostatic chuck 41 and the second electrostatic chuck 42. The resin sheet 5 is wound in a roll shape around the delivery roll 6. As indicated by an arrow in FIG. 10, the resin sheet 5 is guided to the first substrate chucking surface 45 and the second substrate chucking surface 48 through the supply side guide rollers 7 and then wound up by wind-up roll 10 through the collection side guide rollers 11. An example of each of the delivery roll 6, the supply side guide rollers 7, the collection side guide rollers 11, and the wind-up roll 10 can include a member whose diameter is 10 mm to 50 mm, length is equal to or longer than 220 mm, and material is stainless steel or the like. A clean air ionizer may be provided between the delivery roll 6 and the supply side guide rollers 7 on the resin sheet supplying means side to neutralize charges of the resin sheet 5 which are stored by removal charging or the like. A corona discharger can be used instead of the ionizer.

Figure 11:
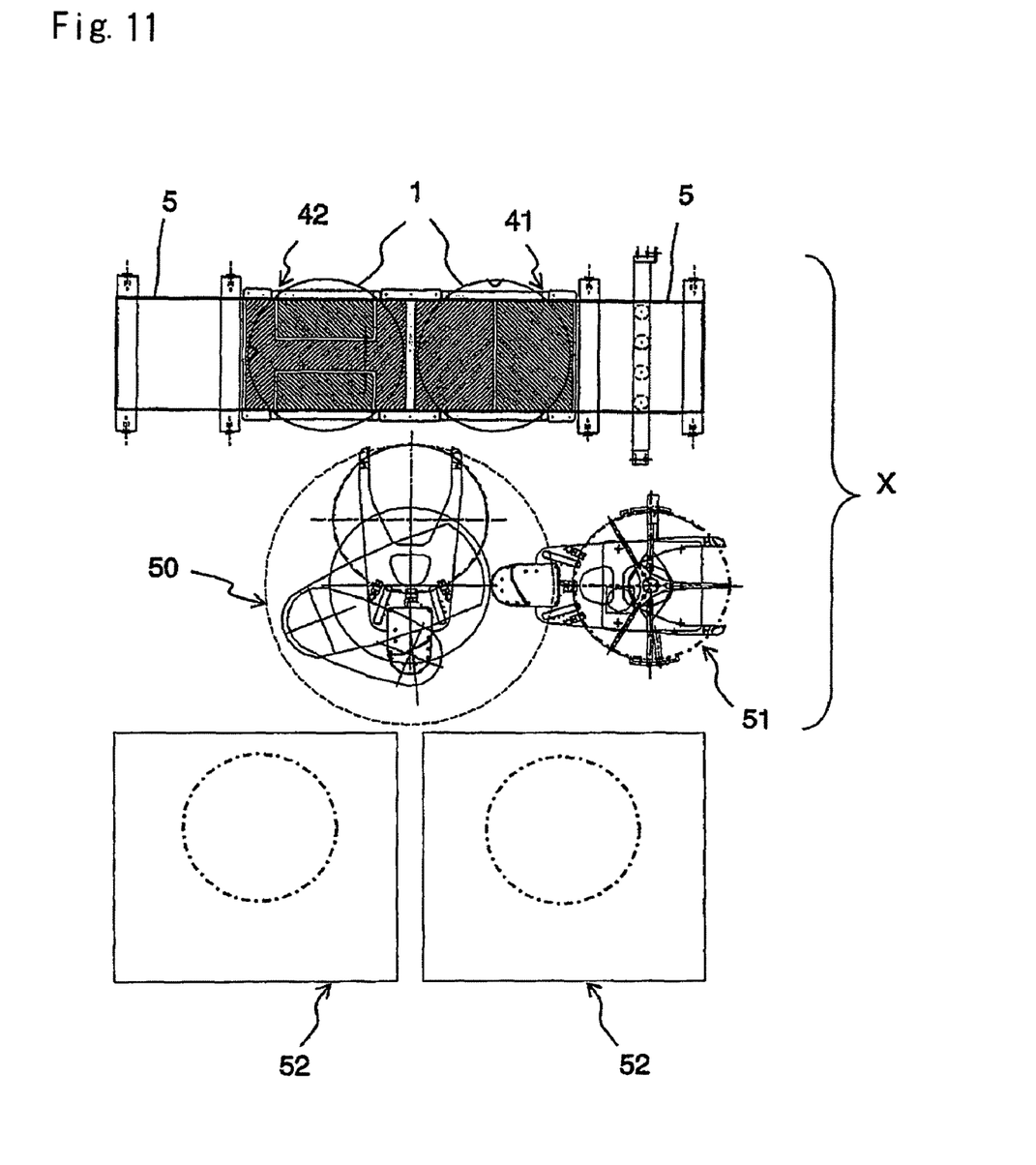
FIG. 11 is an explanatory plan view showing a foreign material removing system in which SMIFs are combined with the foreign material removing apparatus.

As shown in FIG. 11, a foreign material removing apparatus X which further includes a robot arm 50 having a holding portion capable of holding the end portion of the substrate and an aligner (substrate rotating means) 51 capable of adjusting an orientation of the silicon wafer 1 in a direction parallel to the substrate chucking surface, in addition to the above-mentioned structure, is used to remove the foreign materials deposited on the silicon wafer 1. First, the silicon wafer 1 to which the foreign materials are deposited is supplied to the first substrate chucking surface 45 of the first electrostatic chuck 41 by the robot arm 50. Next, a voltage of ±1.5 kV is applied between the first electrode 43 and the second electrode 44 to attract the silicon wafer 1 and then such a chucking state is maintained for 30 seconds. After that, the application of the voltage between the respective electrodes is stopped. Then, the both end portions of the silicon wafer 1 which are the non-chucking areas are held by the holding portion of the robot arm 50 and the silicon wafer 1 is transferred to the aligner 51.

The wafer 1 is rotated 90° by the aligner 51. Then, the wafer 1 is held by the robot arm 50 again and supplied to the second substrate chucking surface 48 of the second electrostatic chuck 42. In this case, the both end portions of the silicon wafer 1 which are not attracted in the case of the first substrate chucking surface 45 and the gap portion between the first electrode 43 and the second electrode 44 are included in an electrode projection area obtained by projecting the first electrode 46 and the second electrodes 47 of the second electrostatic chuck 42 to the wafer side. As in the case of the first electrostatic chuck 41, even in the case of the second electrostatic chuck 42, the wafer 1 is attracted to transfer the foreign materials to the resin sheet 5 side, thereby removing the foreign materials. After the foreign materials are removed in the second electrostatic chuck 42, as in the case of the first electrostatic chuck 41, the both end portions of the wafer 1 which protrude from the second substrate chucking surface 48 are preferably held by the robot arm 50 to collect the wafer 1.

When the foreign materials are to be removed from the wafer 1 using the foreign material removing apparatus X for substrate which includes the first electrostatic chuck 41 and the second electrostatic chuck 42 as described above, for example, the foreign materials are insufficiently transferred to the resin sheet 5 side on the non-chucking area in which a sufficient chucking force may not be applied to the wafer 1 in the first electrostatic chuck 41. Therefore, at least the non-chucking area is reliably attracted by the second electrostatic chuck 42, so a foreign material removal effect can be compensated by the plurality of electrostatic chucks. There is also a merit that wafer processing capability can be improved. In FIG. 10, the orientation of a notch of the wafer 1 attracted to the first electrostatic chuck 41 is upward in the drawing. In the second electrostatic chuck 42 after the rotation of 90°, the notch is adjusted leftward in the drawing.

A plurality of SMIFs 52 may be provided within a movable area of the robot arm 50 to construct a foreign material removing system. The resin sheet 5 which is unprocessed is laid on the respective substrate chucking surfaces. The wafer 1 taken out from one of the SMIFs 52 is subjected to foreign material removal by the first electrostatic chuck 41 and then temporarily transferred to the aligner 51 by the robot arm 50. In the aligner 51, the wafer 1 is rotated by 90°. After that, the wafer 1 is transferred to the second electrostatic chuck 42 by the robot arm 50 again to remove the foreign materials. After the removal of the foreign materials, the wafer 1 is transferred to the aligner 51 by the robot arm 50 again and rotated by 90° to return to the original one of the SMIFs 52. Even in the case of the other SMIFs 52, the same operation is performed, so efficient wafer processing can be realized. When a plurality of aligners 51 is provided, the productivity can be further improved. The chucking and unchucking of the wafer 1 to and from each of the electrostatic chucks may be repeated a plurality of times for each wafer 1 based on a foreign material deposition state and the like. The resin sheet 5 to which the foreign materials are transferred may be exchanged for a new resin sheet 5 for each chucking and unchucking of the wafer 1 or may be exchanged after the repeated use thereof a plurality of times.

INDUSTRIAL APPLICABILITY

The foreign material removing apparatus according to the present invention can suitably perform a foreign material removal operation necessary to process various substrates in, for example, a semiconductor wafer manufacturing facility, a semiconductor device manufacturing facility, a glass substrate manufacturing facility, and a facility for manufacturing a thin display device using, a liquid crystal, a plasma, an organic material, or the like.

The invention claimed is:
1. An, apparatus for removing a foreign material from a substrate, comprising:
   a resin sheet, the resin sheet having a Knoop hardness of 20 Hk to 200 Hk and not having an adhesive surface;
   an electrostatic chuck forming a substrate chucking surface to which the substrate is attracted;
   means for supplying the resin sheet to the substrate chucking surface;
   means for collecting the resin sheet; and
   means for transferring the substrate, wherein:
   the substrate supplied to the electrostatic chuck by the means for transferring the substrate is attracted to the substrate chucking surface through the resin sheet supplied by the means for supplying a resin sheet;
   the substrate contacts the resin sheet face-to-face and between a flat plane of the substrate and a flat plane of the resin sheet;
   foreign material deposited on a side of the substrate facing the substrate chucking surface is transferred to the resin sheet and removed; and
   the resin sheet to which the foreign material is transferred is collected by the means for collecting the resin sheet.

2. An apparatus for removing a foreign material from a substrate according to claim 1, wherein:
   the electrostatic chuck is divided into at least a central electrostatic chuck for attracting a central portion of the substrate and a peripheral electrostatic chuck for attracting a peripheral portion of the substrate;
   the apparatus for removing the foreign material further comprises height direction adjustment means capable of protruding the central electrostatic chuck with respect to the peripheral electrostatic chuck in a perpendicular direction to the substrate chucking surface to form a gap between an end portion of the substrate and the resin sheet; and
   the means for transferring the substrate comprises a robot arm having a substrate holding portion capable of holding the substrate with use of the gap formed between the substrate and the resin sheet.

3. An apparatus for removing a foreign material from a substrate according to claim 2, wherein the height direction adjustment means includes:
   a peripheral chuck lifting mechanism capable of moving the peripheral electrostatic chuck downward in the perpendicular direction from the substrate chucking surface; and a resin sheet height adjustment mechanism capable of adjusting a height position of at least a part of the resin sheet which corresponds to the peripheral electrostatic chuck to a level lower than the substrate chucking surface.

4. An apparatus for removing a foreign material from a substrate according to claim 2, further comprising substrate lift-up means which is inserted into the gap between the substrate and the resin sheet formed by the height direction adjustment means, and is capable of lifting up the substrate.

5. An apparatus for removing a foreign material from a substrate according to claim 2, wherein:
the means for supplying a resin sheet includes:
a delivery roll around which the resin sheet is wound in a roll shape; and
a supply side guide roller for guiding the resin sheet delivered from the delivery roll to the side of the substrate chucking surface; and
the means for collecting the resin sheet includes:
a wind-up roll for winding up the resin sheet; and
a collection side guide roller for guiding the resin sheet fed from the substrate chucking surface to a side of the wind-up roll.

6. An apparatus for removing a foreign material from a substrate according to claim 2, wherein the resin sheet contains at least one material selected from the group consisting of polyvinyl alcohol, low-density polyethylene, polyethylene, polyvinylidene chloride, polyvinyl chloride, polypropylene, polyethylene terephthalate, acetyl cellulose, polycarbonate, nylon, polyimide, aramid, and polycarbodiimide, and has a thickness of 5 µm to 100 µm.

7. An apparatus for removing a foreign material from a substrate according to claim 2, wherein the substrate chucking surface comprises an electrode for the electrostatic chuck.

8. An apparatus for removing a foreign material from a substrate according to claim 2, wherein:
the substrate chucking surface comprises an electrode for the electrostatic chuck; and
the electrode comprises an elastic electrode having Shore hardness of 20 Hz to 90 Hs and volume resistivity of 100 $\Omega \cdot cm$ to $1 \times 10^{-5}$ $\Omega \cdot cm$, and has a thickness of 0.05 mm to 3 mm.

9. An apparatus for removing a foreign material from a substrate according to claim 1, further comprising:
at least two electrostatic chucks including a first electrostatic chuck forming a first substrate chucking surface and a second electrostatic chuck forming a second substrate chucking surface; and
substrate rotating means capable of adjusting an orientation of the substrate in a direction parallel to the substrate chucking surfaces,
wherein the orientation of the substrate from which the foreign material is removed by the first electrostatic chuck is adjusted by the substrate rotating means and the substrate is supplied to the second electrostatic chuck to further remove a foreign material.

10. An apparatus for removing a foreign material from a substrate according to claim 9, wherein the substrate rotating means adjusts the orientation of the substrate such that a non-chucking area of the substrate which does not overlap with an electrode of the first electrostatic chuck when the electrode is projected to a substrate side attracted to the first substrate chucking surface is included in an electrode projection area obtained by projecting an electrode of the second electrostatic chuck to the substrate side; and the second electrostatic chuck removes the foreign material.

11. An apparatus for removing a foreign material from a substrate according to claim 9, wherein:
each of the first electrostatic chuck and the second electrostatic chuck comprises a bipolar electrostatic chuck having two electrodes to which voltages whose potentials are different from each other are respectively applied; and
the substrate rotating means adjusts the orientation of the substrate such that a non-chucking area of the substrate which corresponds to an interval between the two electrodes of the first electrostatic chuck is included in an electrode projection area obtained by projecting the two electrodes of the second electrostatic chuck to a substrate side, and the second electrostatic chuck removes the foreign material.

12. An apparatus for removing a foreign material from a substrate according to claim 9, wherein:
each of a non-chucking area of the substrate which does not overlap with an electrode of the first electrostatic chuck when the electrode is projected to a substrate side attracted to the first substrate chucking surface and a non-chucking area of the substrate which does not overlap with an electrode of the second electrostatic chuck when the electrode is projected to a substrate side attracted to the second substrate chucking surface includes an end portion of the substrate; and
the means for transferring the substrate comprises a robot arm having a substrate holding portion capable of holding the substrate with use of the end portion of the substrate.

13. An apparatus for removing a foreign material from a substrate according to claim 9, wherein the resin sheet contains at least one material selected from the group consisting of polyvinyl alcohol, low-density polyethylene, polyethylene, polyvinylidene chloride, polyvinyl chloride, polypropylene, polyethylene terephthalate, acetyl cellulose, polycarbonate, nylon, polyimide, aramid, and polycarbodiimide, and has a thickness of 5 µm to 100 µm.

14. An apparatus for removing a foreign material from a substrate according to claim 9, wherein:
the means for supplying a resin sheet includes:
a delivery roll around which the resin sheet is wound in a roll shape; and
a supply side guide roller for guiding the resin sheet delivered from the delivery roll to a side of the first substrate chucking surface; and
the means for collecting the resin sheet includes:
a wind-up roll for winding up the resin sheet; and
a collection side guide roller for guiding the resin sheet fed from the second substrate chucking surface to a side of the wind-up roll.

15. An apparatus for removing a foreign material from a substrate according to claim 9, wherein each of the first substrate chucking surface and the second substrate chucking surface comprises an electrode for each of the electrostatic chucks.

16. An apparatus for removing a foreign material from a substrate according to claim 9, wherein:
each of the first substrate chucking surface and the second substrate chucking surface comprises an electrode for each of the electrostatic chucks; and
each electrode comprises an elastic electrode having Shore hardness of 20 Hs to 90 Hs and volume resistivity of 100 $\Omega \cdot cm$ to $1 \times 10^{-5}$ $\Omega \cdot cm$, and has a thickness of 0.05 mm to 3 mm.

* * * * *